US010547280B2

(12) United States Patent
Fok et al.

(10) Patent No.: US 10,547,280 B2
(45) Date of Patent: Jan. 28, 2020

(54) PHOTONICS BASED TUNABLE MULTIBAND MICROWAVE FILTER

(71) Applicant: University of Georgia Research Foundation, Inc., Athens, GA (US)

(72) Inventors: Mable P. Fok, Bishop, GA (US); Jia Ge, Athens, GA (US)

(73) Assignee: University of Georgia Research Foundation, Inc., Athens, GA (US)

(*) Notice: Subject to any disclaimer, the term of this patent is extended or adjusted under 35 U.S.C. 154(b) by 53 days.

(21) Appl. No.: 15/557,454

(22) PCT Filed: Mar. 11, 2016

(86) PCT No.: PCT/US2016/022074
§ 371 (c)(1),
(2) Date: Sep. 11, 2017

(87) PCT Pub. No.: WO2016/145347
PCT Pub. Date: Sep. 15, 2016

(65) Prior Publication Data
US 2018/0062603 A1 Mar. 1, 2018

Related U.S. Application Data

(60) Provisional application No. 62/132,101, filed on Mar. 12, 2015.

(51) Int. Cl.
*H03H 2/00* (2006.01)
*G02B 6/27* (2006.01)
*G02B 6/293* (2006.01)

(52) U.S. Cl.
CPC ............ *H03H 2/003* (2013.01); *G02B 6/274* (2013.01); *G02B 6/29389* (2013.01); *G02B 6/29395* (2013.01)

(58) Field of Classification Search
CPC .... H03H 2/003; H03H 2250/00; G02B 6/274; G02B 6/27; G02B 6/2726; G02B 6/2746;
(Continued)

(56) References Cited

U.S. PATENT DOCUMENTS 4,017,807 A * 4/1977 Hutcheson .......... H01S 3/08009
372/102
6,943,931 B1 * 9/2005 Dingel .................. G02F 1/2255
359/279

(Continued)

OTHER PUBLICATIONS

Huang, L.; et, al., "Microwave photonic filter with multiple independently tunable passbands based on a broadband optical source". Optics Express, vol. 23, No. 20 (Sep. 2015) 14 pages.

(Continued)

*Primary Examiner* — John R Lee
(74) *Attorney, Agent, or Firm* — Thomas Horstemeyer, LLP (57) ABSTRACT

Various examples are provided for tunable radio frequency (RF) filtering. In one example, a RF multiband filter includes a Lyot filter including a tunable birefringence loop including a circulator and a polarization controller (PC) and a phase modulator (PM). The Lyot filter can generate an optical comb based at least in part upon a received optical signal and a polarization rotation angle of the polarization controller. The phase modulator (PM) can generate a modulated tap signal by modulating the optical comb by a RF input signal.

20 Claims, 7 Drawing Sheets

(58) Field of Classification Search
CPC ............ G02B 6/29379; G02B 6/29389; G02B 6/29395; G02B 6/12007; G02F 1/00; G02F 1/225; G02F 1/21; H04B 2210/006; H04B 1/7093; H04B 10/00; H01P 1/20; H01P 1/201; H01P 1/203; H01P 1/20327; H01P 1/20336; H01P 1/205; H01P 1/2053
See application file for complete search history.

(56) References Cited

U.S. PATENT DOCUMENTS

| | | | | |
|---|---|---|---|---|
| 8,111,722 | B1* | 2/2012 | Maleki | G02F 1/353 372/18 |
| 8,498,539 | B1* | 7/2013 | Ilchenko | H04B 10/90 398/115 |
| 2003/0053747 | A1* | 3/2003 | Cormack | G02B 6/2935 385/24 |
| 2003/0161568 | A1* | 8/2003 | El-Refaei | G02B 6/02085 385/11 |
| 2003/0175036 | A1* | 9/2003 | Mamyshev | H04B 10/505 398/188 |
| 2004/0251991 | A1* | 12/2004 | Rahman | H01P 1/20 333/205 |
| 2005/0012978 | A1* | 1/2005 | Ibe | H04B 10/505 359/279 |
| 2006/0120656 | A1* | 6/2006 | Han | G02B 6/274 385/11 |
| 2009/0092350 | A1* | 4/2009 | Gill | G02F 1/225 385/3 |
| 2011/0007383 | A1* | 1/2011 | Gheorma | G02F 1/2255 359/326 |
| 2012/0229886 | A1* | 9/2012 | Chen | H04B 10/506 359/326 |
| 2013/0183041 | A1* | 7/2013 | Wan | H04B 1/28 398/81 |
| 2015/0207291 | A1* | 7/2015 | Rickman | H01S 5/142 372/20 |
| 2016/0087716 | A1* | 3/2016 | McKinney | H04B 10/079 398/25 |
| 2016/0116678 | A1* | 4/2016 | Evans | G01J 1/4257 385/1 |
| 2016/0367132 | A1* | 12/2016 | Yun | A61B 3/102 |
| 2018/0027314 | A1* | 1/2018 | Fok | G02B 6/29389 370/497 |
| 2018/0054175 | A1* | 2/2018 | Fok | G02F 1/225 |
| 2018/0062603 | A1* | 3/2018 | Fok | G02B 6/29389 |

OTHER PUBLICATIONS

Gao, L.; et, al., "Microwave Photonic Filter With Two Independently Tunable Passbands Using a Phase Modulator and an Equivalent Phase-Shifted Fiber Bragg Grating" IEEE Transactions on Microwave Theory and Techniques, vol. 62, No. 2 (Feb. 2014) pp. 380-387.

International Search Report for PCT/US2016/022074 dated Jun. 3, 2016.

Fok, "Optical Processing Techniques for Advanced Fiber-Optic Communication Systems", The Chinese University of Hong Kong, Aug. 2007, 63 pages.

Chen, et al., "Switchable and tunable microwave frequency multiplication based on a dual-passband microwave photonic filter", Optics Express 9835, Published Apr. 9, 2015, vol. 23, No. 8, 9 pages.

Supradeepa, et al., "Comb-based radiofrequency photonic filters with rapid tunability and high selectivity", Nature Photonics, vol. 6, Mar. 2012, pp. 186-194.

Jiang, et al., "A Selectable Multiband Bandpass Microwave Photonic Filter", IEEE Photonics Journal, vol. 5, No. 3, Jun. 2013, 9 pages.

* cited by examiner

| Number | Length Combination | Equivalent PMF length ($L_e$, m) | MWP Filter passband ($\Omega_0$, GHz) |
|---|---|---|---|
| 1 | $L_1$ | 2 | 0.8 |
| 2 | $2L_1$ | 4 | 1.6 |
| 3 | $|2L_1-L_2|$ | 6 | 2.4 |
| 4 | $|L_1-L_2|$ | 8 | 3.2 |
| 5 | $L_2$ | 10 | 4.0 |
| 6 | $L_1+L_2$ | 12 | 4.8 |
| 7 | $2L_1+L_2$ | 14 | 5.6 |
| 8 | $|2L_1-2L_2|$ | 16 | 6.4 |
| 9 | $|L_1-2L_2|$ | 18 | 7.2 |
| 10 | $2L_2$ | 20 | 8.0 |
| 11 | $L_1+2L_2$ | 22 | 8.8 |
| 12 | $2L_1+2L_2$ | 24 | 9.6 |

PHOTONICS BASED TUNABLE MULTIBAND MICROWAVE FILTER

CROSS REFERENCE TO RELATED APPLICATIONS

This application is the 35 U.S.C. § 371 national stage application of PCT Application No. PCT/US2016/022074, filed Mar. 11, 2016, which claims priority to, and the benefit of, U.S. provisional application entitled "PHOTONICS BASED TUNABLE MULTIBAND MICROWAVE FILTER" having Ser. No. 62/132,101, filed Mar. 12, 2015, both of which are herein incorporated by reference in their entireties.

STATEMENT REGARDING FEDERALLY SPONSORED RESEARCH OR DEVELOPMENT

This invention was made with government support under agreement CNS 1217435 and 1342177 awarded by the National Science Foundation. The Government has certain rights in the invention.

BACKGROUND

A Radio frequency (RF) bandpass filter is a component that to select signals with the desired frequency and block the unwanted or interfering frequency bands, which is widely used in various applications including radar systems, wireless communications and satellite communications. RF bandpass filters with multiple passbands and flexible configuration capability are desirable for the multiplexing of multiband signals that are commonly found in multiband wireless communication systems.

SUMMARY

Embodiments of the present disclosure are related to radio frequency (RF) filtering.

In one embodiment, among others, a radio frequency (RF) filter comprises a Lyot filter comprising a tunable birefringence loop comprising a circulator and a polarization controller (PC) and a phase modulator (PM) configured to generate a modulated tap signal by modulating the optical comb by a RF input signal. The Lyot filter can be configured to generate an optical comb based at least in part upon a received optical signal and a polarization rotation angle of the polarization controller. In another embodiment, a method comprises generating an optical comb based at least in part upon a received optical signal and a polarization rotation angle of a polarization controller and generating a modulated tap signal by modulating the optical comb by a RF input signal. In one or more aspects of these embodiments, the tunable birefringence loop can comprise a length of polarization maintaining fiber (PMF), the PC is coupled to a distal end of the PMF via the circulator. The PC can be configured to adjust the polarization rotation angle in a range from 0° to 90°. The received optical signal can be provided to a proximal end of the PMF via a loop coupling circulator of the Lyot filter. The received optical signal can be received by the loop coupling circulator through a first polarizer of the Lyot filter.

In one or more aspects of these embodiments, the optical comb can be provided to the PM through a second polarizer of the Lyot filter. The optical comb provided to the PM can be amplified. The Lyot filter can comprise a second tunable birefringence loop comprising a second circulator and a second PC. The second tunable birefringence loop can be coupled in series by a second loop coupling circulator. The second tunable birefringence loop can comprise a second PMF, the second PC coupled to a distal end of the second PMF via the second circulator. An output from the tunable birefringence loop can be provided to a proximal end of the second PMF via the second loop coupling circulator. The output from the tunable birefringence loop can be provided to the proximal end of the second PMF via a third PC. The received optical signal can be received by the loop coupling circulator through a first polarizer of the Lyot filter. The optical comb can be provided to the PM through a second polarizer after the second loop coupling circulator.

In one or more aspects of these embodiments, the RF filter can comprise a photo-detector (PD) configured to generate a RF output signal based upon the modulated tap signal. The RF output signal can comprise six passbands or more. The RF output signal can comprise ten passbands or more. Passbands of the RF output signal can comprise an even 3-dB bandwidth of 200 MHz and greater than 30 dB sidelobe suppression. The RF filter can comprise a piece of dispersion compensating fiber (DCF) between the PM and the PD to provide a linear delay for wavelengths of the modulated tap signal. The received optical signal can comprise a broadband optical signal filtered by a Gaussian optical filter. The Gaussian optical filter can apodize amplitudes of the modulated tap signal.

Other systems, methods, features, and advantages of the present disclosure will be or become apparent to one with skill in the art upon examination of the following drawings and detailed description. It is intended that all such additional systems, methods, features, and advantages be included within this description, be within the scope of the present disclosure, and be protected by the accompanying claims. In addition, all optional and preferred features and modifications of the described embodiments are usable in all aspects of the disclosure taught herein. Furthermore, the individual features of the dependent claims, as well as all optional and preferred features and modifications of the described embodiments are combinable and interchangeable with one another.

BRIEF DESCRIPTION OF THE DRAWINGS

Many aspects of the present disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Disclosed herein are various examples related to radio frequency (RF) filtering. Reference will now be made in detail to the description of the embodiments as illustrated in the drawings, wherein like reference numbers indicate like parts throughout the several views.

Implementing a RF bandpass filter with multiple passbands is difficult to achieve using conventional RF electronics techniques because of the lack of tunability in RF electronics, and it is difficult to simultaneously satisfy all the design parameters for all passbands. An example of a RF bandpass filter with six passbands is demonstrated based on the use of several cascaded resonators, which is inflexible and has a limited number of passbands. Microwave photonic (MWP) RF filtering has received increasing attention in recent years owing to the significant improvements over conventional RF filtering, such as low-loss, wide bandwidth, flexibility, tunability, and reconfigurability. Different approaches for MWP bandpass filters include multi-tap delay line schemes and optical frequency comb schemes. However, most existing approaches either lack the ability to support multiband operation, or the resultant passbands are periodic over a very wide frequency range, limiting its ability to isolate unwanted frequencies. To achieve multiple passbands in a MWP filter, the optical frequency comb can either include multiple free spectral ranges (FSR) simultaneously or can be sampled spectrally. However, multiband bandpass filtering can still be very challenging to achieve because of the scalability, uniformity, and selectivity of the schemes. Previous attempts achieved a MWP multiband bandpass filter that consisted of three passbands with non-uniform bandwidths based on the use of three pieces of birefringence fibers in a loop mirror filter configuration, while another MWP multiband bandpass filter with suppression ratio of 10 dB is achieved with wavelength sampling.

In a first embodiment, a frequency band selectable MWP multiband bandpass filter (or MWP multiband filter) based on the use of a one-stage Lyot filter (also called Lyot loop filter) is disclosed and experimentally demonstrated. The Lyot filter can be used to slice the broadband optical source and generate an optical comb with four different spectral characteristics, which is selectable by adjusting the polarization state within the Lyot filter. Correspondingly, a selectable MWP bandpass filter with four operating states, e.g. single-bandpass filtering with two different selectable frequencies, multi-bandpass filtering, and an all-block RF filtering, can be achieved with just one single piece of polarization maintaining fiber (PMF). The MWP filter has sharp filter profile and high bandpass selectivity of about 46 dB (or better) sidelobe suppression.

Figure 1:
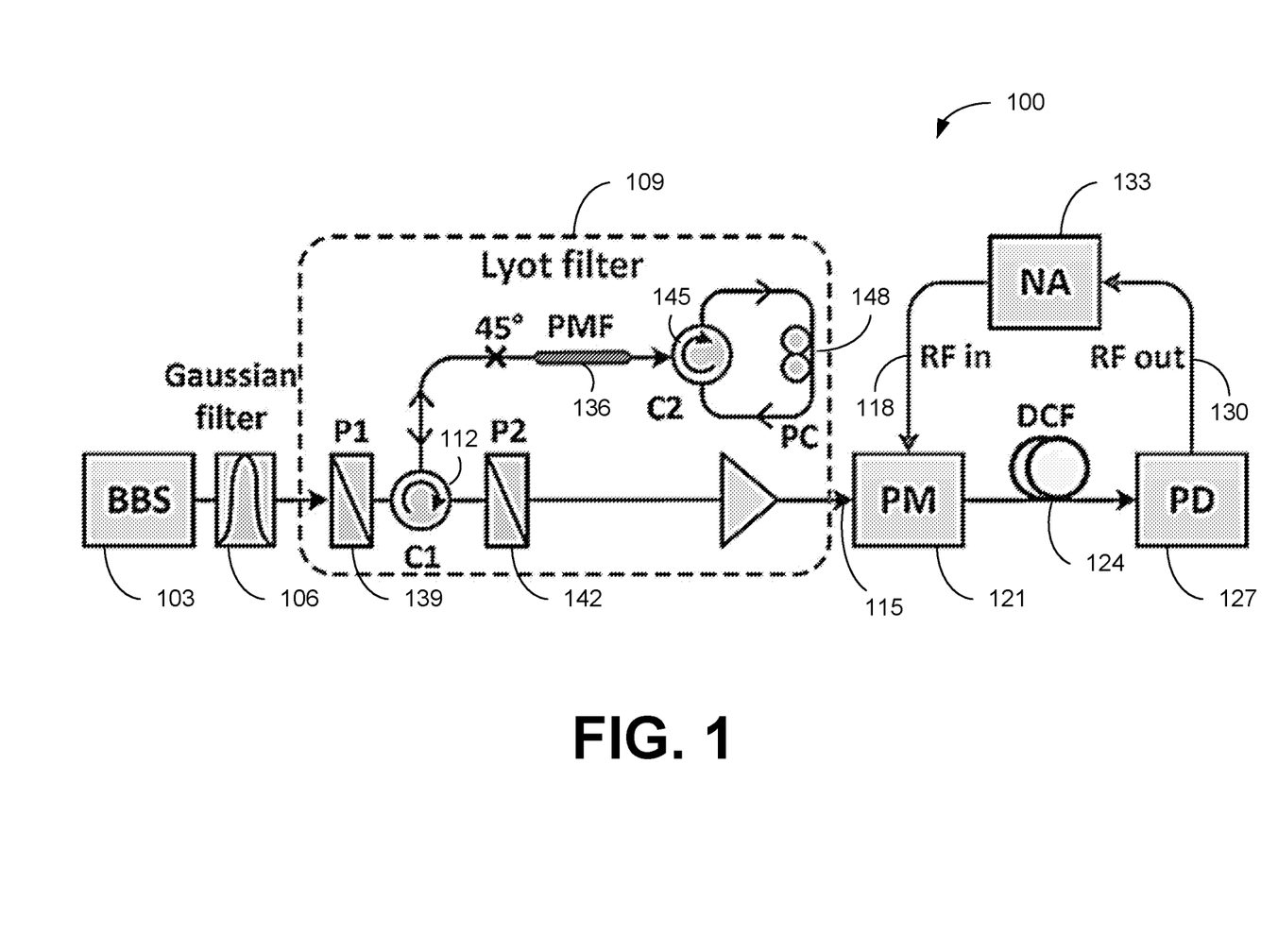
FIG. 1 is a schematic diagram of an example of a frequency band selectable microwave photonic (MWP) multiband bandpass filter (or MWP multiband filter) in accordance with various embodiments of the present disclosure.

Referring to FIG. 1, shown is an example of an experimental setup of a frequency band selectable MWP multiband bandpass filter 100. Light from a broadband source (BBS) 103 can be reshaped by a Gaussian profile optical filter 106 and then spectrally sliced by a Lyot filter 109 through a circulator (C1) 112, which may be referred to as a loop or stage coupling circulator. The generated optical comb works as a multi-wavelength source 115 that is modulated by a RF input signal 118 through a phase modulator (PM) 121. The Gaussian optical filter 106 can be used to apodize the amplitude of the multi-wavelength source 115 such that a single bandpass frequency response with good sidelobe suppression in RF domain can be obtained. A piece of dispersion compensating fiber (DCF) 124 can be used to provide a linear time delay for the different wavelengths (filter taps), and the modulated signal can then be fed into a photo-detector (PD) 127 where it is converted back to a RF output signal 130. In some embodiments, the DCF 124 can be replaced by another device (e.g., a linearly chirped fiber Bragg grating (FBG)) that can provide the linear time delay. In the example of FIG. 1, a network analyzer (NA) 133 is used to provide the RF input signal 118 for measuring frequency response of the system.

The Lyot filter 109 illustrated in FIG. 1 is a modified version of a standard Lyot filter that allows the light to propagate through the polarization maintaining fiber (PMF) 136 twice bi-directionally through the circulators C1 112 and C2 145. A first polarizer (P1) 139 is aligned with a second polarizer (P2) 142. A phase difference of $\Delta\varphi=2\pi BL/\lambda$ can be obtained between the fast and slow axis when the light passes through the PMF at 45° with respect to the axis, where B and L are the birefringence and length of the PMF 136, respectively, and $\lambda$ is the wavelength of the light. By allowing the light to propagate twice bi-directionally in the PMF 136 through the circulator (C2) 145 and adjusting the polarization controller (PC) 148 to rotate the light to a different polarization angle of 0°, 45° or 90°, an accumulated phase difference of $2\Delta\varphi$, $\Delta\varphi$ and 0 can be obtained, corresponding to a piece of PMF 136 with an equivalent length ($L_e$) of 2L, L and 0, respectively. As a result, a comb filter with selectable comb spacing can be achieved. By adjusting the polarization stage inside the Lyot filter 109, the MWP multiband bandpass filter 100 can work in either all-block, single-passband, or multi-passband states.

Figure 2:
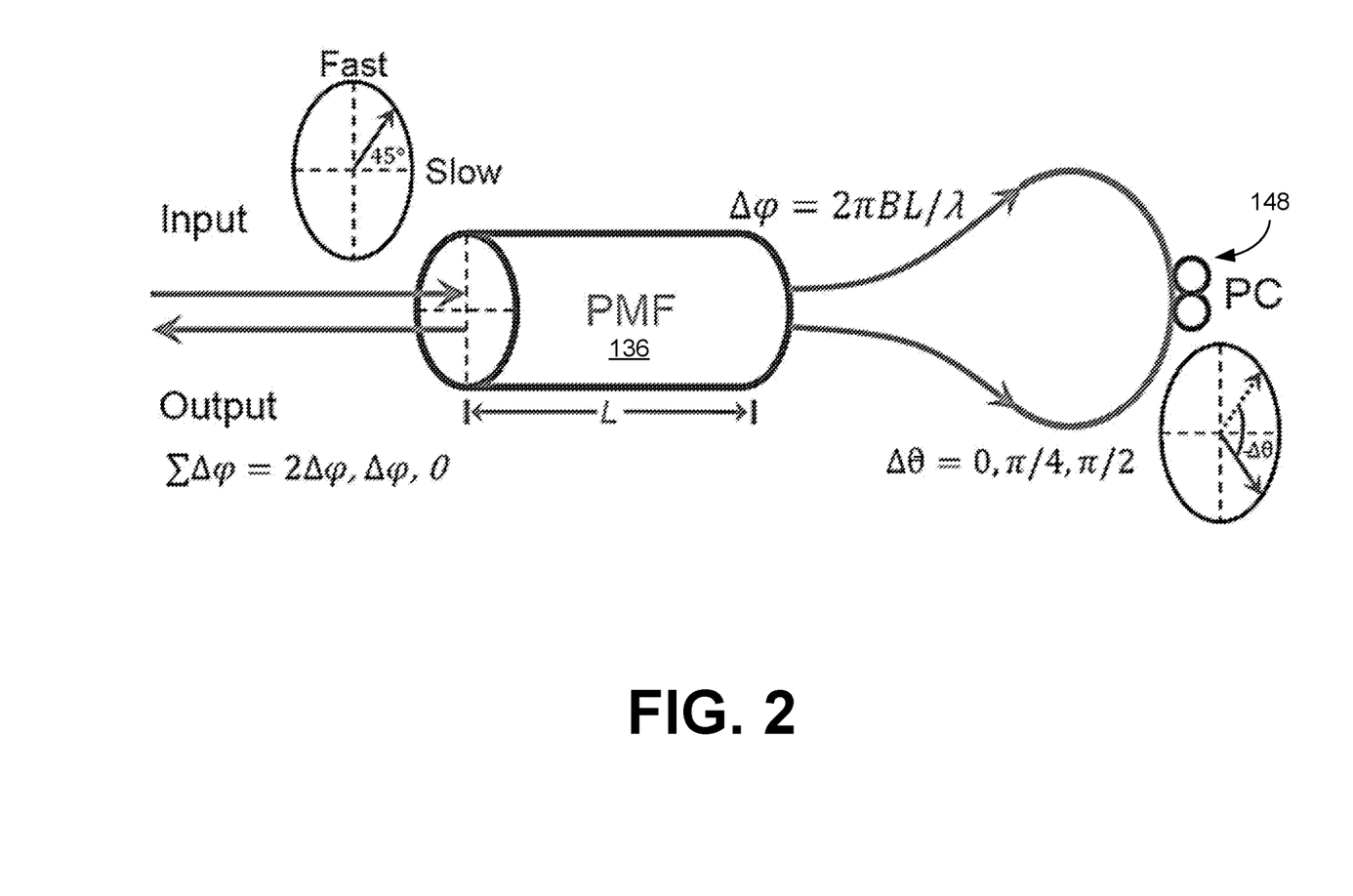
FIG. 2 is a graphical representation illustrating an example of a circulator-polarization controller (circulator-PC) based loop in the Lyot filter of the MWP multiband filter of FIG. 1 in accordance with various embodiments of the present disclosure.

An example of the operating principle of the bidirectional Lyot filter is illustrated in FIG. 2. As shown, light propagates through the PMF 136 twice bi-directionally through a circulator-PC based loop. A phase difference of $\Delta\varphi=2\pi BL/\lambda$ is obtained between the fast and slow axis when the light passes through the PMF 136 at 45° with respect to the fast axis, where B and L are the birefringence and length of the PMF 136 and $\lambda$ is the wavelength of the light. By allowing the light to propagate twice in the PMF 136 bi-directionally and adjusting the PC 148 inside the loop to let the light have a different polarization rotation angle ($\Delta\theta$) of 0°, 45° or 90° at the circulator-PC based loop, a total phase difference ($\Sigma\Delta\varphi$) of $2\Delta\varphi$, $\Delta\varphi$ and 0 can be obtained at the output, respectively. With different polarization rotation angles ($\Delta\theta$), each stage works as one piece of PMF 136 with an adjustable equivalent length ($L_e$) of 2L, L and 0, correspondingly. As a result, a comb filter with adjustable comb spacings can be achieved with its transmission function described by:

$$T(\lambda)=\tfrac{1}{2}[1-\cos(\Sigma\varphi(\lambda))]. \tag{1}$$

Comb spacing ($\Delta\omega$, in angular frequency) of the Lyot filter 109 (FIG. 1) can be determined by the equivalent length of PMF 136, as given by:

$$\Delta\omega = \frac{2\pi C}{BL_e}, \quad (2)$$

where C is the speed of light.

Comb spacing of the Lyot filter 109 determines the carrier wavelength for each of the taps in the MWP multiband filter 100, which in turn determines the frequency of the passband. Apodizing the tap amplitude with a Gaussian optical filter 106 (FIG. 1) results in a bandpass response in the RF domain with good sidelobe suppression. Passband frequency ($\Omega_0$) of the MWP multiband filter 100 is governed by:

$$\Omega_0 = \frac{2\pi}{\beta_2 L_D \Delta\omega} = \frac{BL_e}{\beta_2 L_D C}, \quad (3)$$

where $\beta_2$ and $L_D$ are the group velocity dispersion and length of the DCF, respectively. Both $\beta_2$ and $L_D$ were kept constant in the experimental testing. That is to say, the passband frequency ($\Omega_0$) is mainly governed by the optical comb spacing, which is tunable by adjusting the PC 148 in the Lyot filter 109. When the DCF has negligible dispersion slope, the 3-dB bandwidth of the passbands can be determined by:

$$\delta\Omega_{3dB} = \frac{\sqrt{8\ln 2}}{\beta_2 L_D \delta\omega}, \quad (4)$$

where $\delta\omega$ is the overall bandwidth of the Gaussian optical comb. As shown, the bandwidth of the MWP multiband filter 100 ($\delta\Omega_{3dB}$) is inversely proportional to the bandwidth of the optical comb, which is adjustable to meet the needs of different applications.

The Lyot filter 109 can be tuned to have multiple comb spacings simultaneously by setting it to be a higher order filter, just like its loop mirror filter counterpart. For the Lyot filter 109, when the polarization rotation angle at the circular-PC based loop is set to a value between 0° and 45°, two optical combs with different comb spacings can be observed. This situation can be regarded as two optical combs with different spacing appearing at the same time, which makes it possible to generate a MWP multiband bandpass filter 100 with two (or more) passbands. With different comb spacing combinations, a MWP multiband filter 100 with selectable frequency bands can be achieved.

For example, when the PC 148 was adjusted to set the polarization rotation angle to a value between 0° and 45°, two optical combs with different comb spacings and amplitude interleaving were observed. As discussed, the angular frequency spacing of the MWP multiband filter 100 can be determined by the equivalent length ($L_e$) of the PMF 136, and can be described by $\Delta\omega=2\pi C/BL_e$. The passband frequency ($\Omega_0$) of the MWP multiband filter 100 is governed by $\Omega_0=2\pi/\beta_2 L_D\Delta\omega$, where $\beta_2$ and $L_D$ are the group velocity dispersion and length of the DCF 124 (respectively), which are fixed in the experimental testing. Thus, the passband is mainly governed by the optical comb spacing, which is tunable by adjusting the PC 148 in the Lyot filter 109. With different comb spacing combinations, a frequency band selectable MWP multiband bandpass filter 100 can be achieved.

Figure 3A:
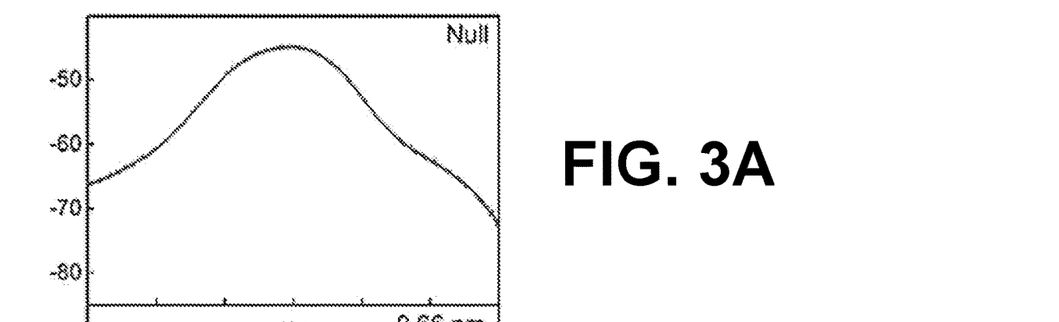
FIGS. 3A-3D and 4A-4D show examples of optical comb spectra and passband frequency response, respectively, of the MWP multiband filter of FIG. 1 in accordance with various embodiments of the present disclosure.
Figure 3B:
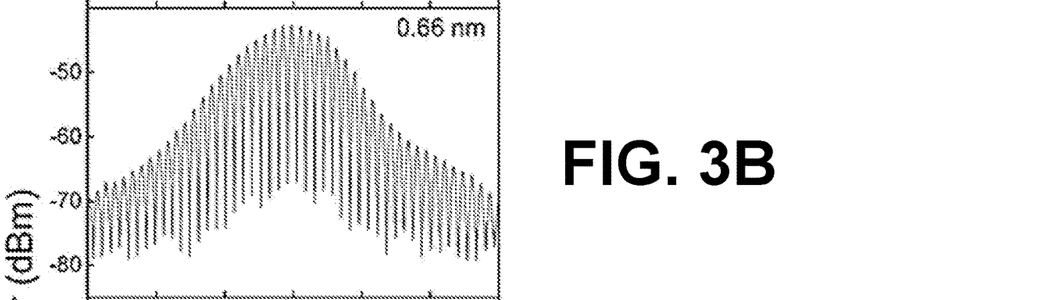
Figure 3C:
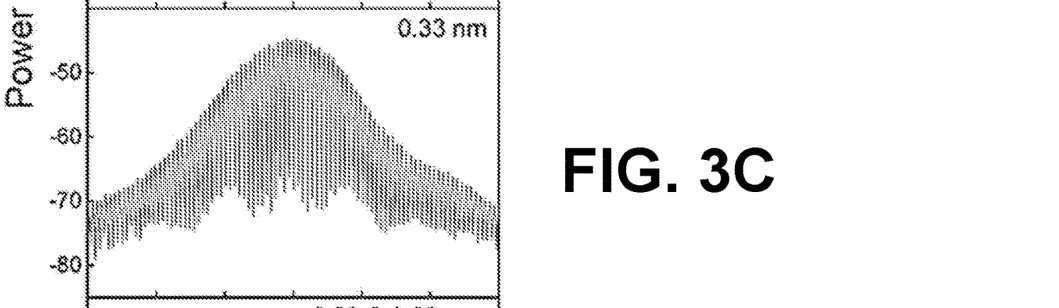
Figure 3D:
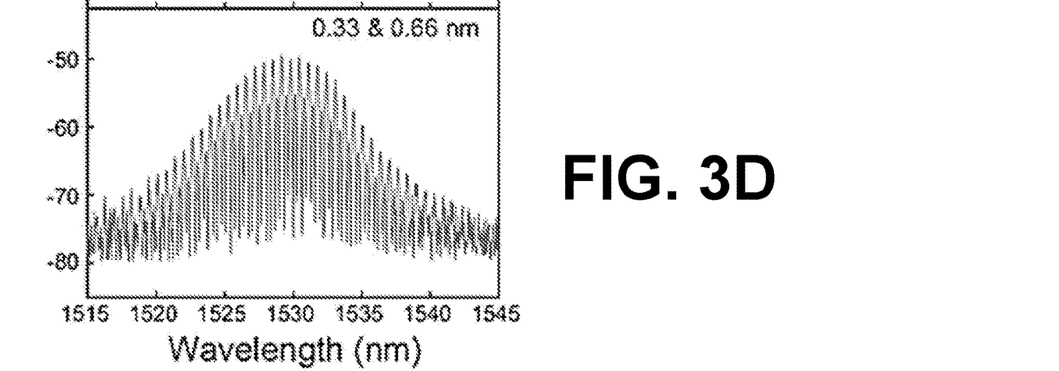
Figure 4A:
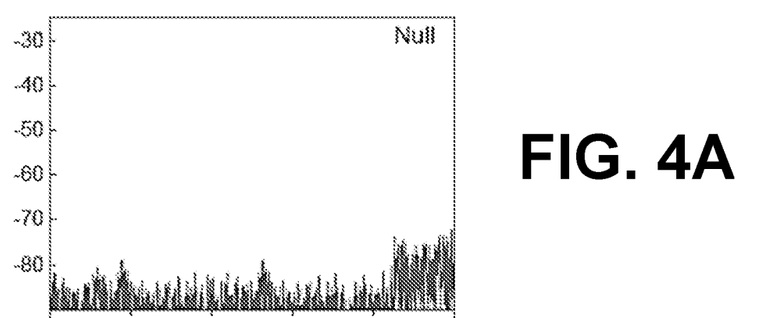
Figure 4B:
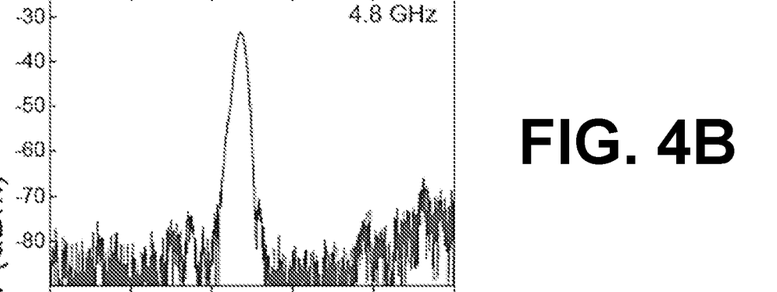
Figure 4C:
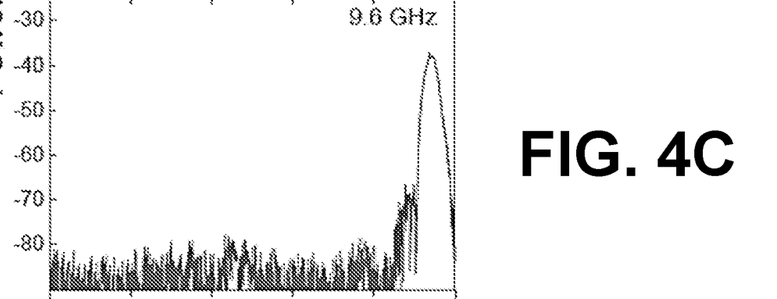
Figure 4D:
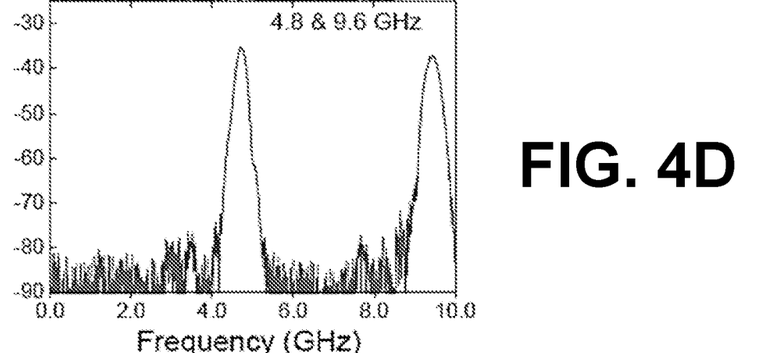

FIGS. 3A-3D and 4A-4D show examples of measured experimental results using the MWP multiband filter 100. A 30-nm wide Gaussian optical comb with four different comb spacing combinations was observed for 0 nm, 0.66 nm, 0.33 nm, and interleaved 0.66 & 0.33 nm, corresponding to a PMF 136 with an equivalent length ($L_e$) of 0 m, 12 m, 24 m, and cascaded 12 & 24 m, respectively. FIG. 3A shows the measured optical comb spectra of the MWP filter 100 with zero (or null) spacing, FIG. 3B shows the measured optical comb spectra with a 0.66 nm spacing, FIG. 3C shows the measured optical comb spectra with a 0.33 nm spacing, and FIG. 3D shows the measured optical comb spectra with an interleaved 0.33 and 0.66 nm spacing. The extinction ratios of the comb are over 20 dB for all four combinations. The corresponding passband frequency response of the MWP multiband filter 100 generated from each optical comb is shown in FIGS. 4A-4D, respectively. In FIG. 4A, no passband was observed with the MWP multiband filter 100 working in the "all-block" state. While in FIGS. 4B and 4C, the MWP multiband filter 100 is operating in a "single-passband" state with only one passband at 4.8 GHz or 9.6 GHz being observed, respectively. By properly adjusting the PC 148 to have two different comb spacing at the same time, two clean passbands were observed with the MWP multiband filter 100 working in a "multi-passband" state, as shown in FIG. 4D. The four different working states of the MWP multiband filter 100 are switchable by adjusting PC 148 to different polarization rotation angles. All the passbands show a sharp filter profile and consistent performance, with sidelobe suppression of 46 dB and 3-dB bandwidth of 200 MHz.

In a second embodiment, a frequency band selectable MWP multiband bandpass filter (or MWP multiband filter) based on the use of a two-stage Lyot filter is disclosed and experimentally demonstrated. The two-stage Lyot filter can be used to spectrally slice a broadband source, and an optical comb with twelve tunable comb spacing can be generated using just two pieces of polarization maintaining fiber (PMF). One or more comb spacing can be selected at the same time. Correspondingly, a selectable MWP multiband bandpass filter with three operating states, e.g. a single-passband state, a multi-passband state, and an all-block state can be achieved. In the single-passband state, the MWP filter has only one passband and can be tuned to 12 different frequencies. While in the multi-passband state, up to 12 passbands within the frequency band of interest can be observed at the same time. Both the passband numbers and frequencies can be flexibly tuned by adjusting the polarization state in the two-stage Lyot filter. Sidelobe suppression of the passbands in the single-passband state can be up to 40 dB, and all the passbands show greater than 30 dB sidelobe suppression in the multi-passband state. All the passbands have uniform and clean filter profiles as well as a similar passband bandwidth of 200 MHz. Testing demonstrated a MWP multiband bandpass filter with this selectable multiband capability.

Figure 5:
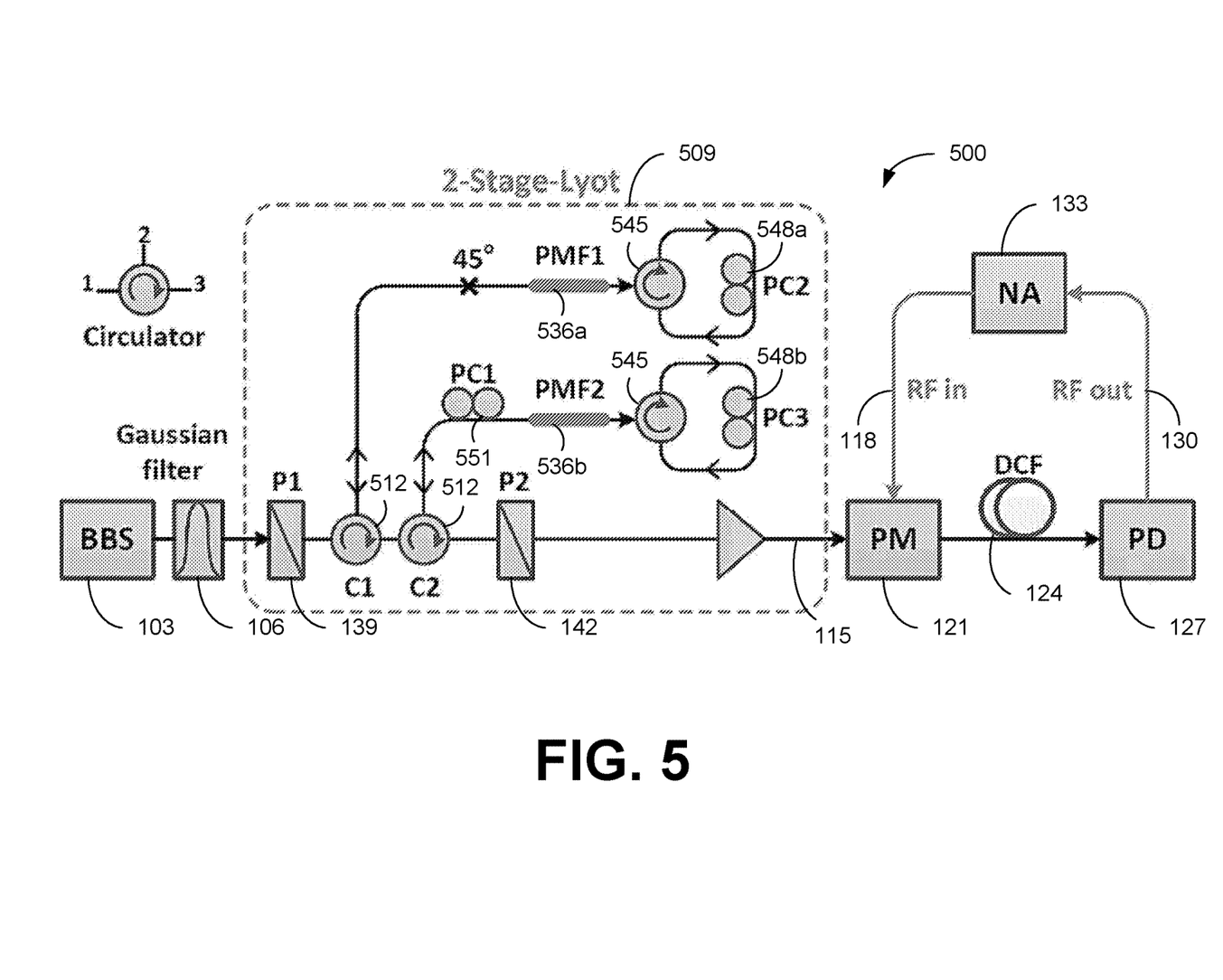
FIG. 5 is a schematic diagram of an example of another frequency band selectable microwave photonic (MWP) multiband bandpass filter (or MWP multiband filter) in accordance with various embodiments of the present disclosure.

Referring to FIG. 5, shown is an example of an experimental setup of another frequency band selectable MWP multiband bandpass filter 500. A broadband amplified spontaneous emission source was used as the broadband light source (BBS) 103 during testing and reshaped by an optical filter 106 with Gaussian profile. The reshaped broadband source (BBS) 103 is launched into a two-stage Lyot filter 509 for spectrally slicing via polarizer (P1) 139. Polarizer (P2) 142 is aligned with P1 139 like the one-stage Lyot filter 109 of FIG. 1. At the output of P2 142, an optical comb source is generated which works as a multi-wavelength optical carrier 115 for electrical-to-optical conversion, which is modulated by the RF input signal 118 through a phase modulator (PM) 121. Each comb line is a single tap for the MWP multiband filter 500, while the Gaussian optical filter 106 is used to apodize the amplitude of the taps such that the sidelobes can be further suppressed and resulting in clean bandpass profile with high sidelobe suppression. The modulated signal is then launched into a piece of dispersion compensating fiber (DCF) 124, which provides linear time delay for each filter taps. That is to say, each of the taps can be weighted by the Gaussian filter 106 and delayed by the DCF 124. The signal is then fed into a photo-detector (PD) 127 and converted back to a RF output signal 130. In the experimental tests, a 300 kHz-10 GHz sweeping signal from a network analyzer (NA) 133 was used as the RF input signal 118 for measuring the frequency response of the MWP multiband bandpass filter 500.

Figure 6:
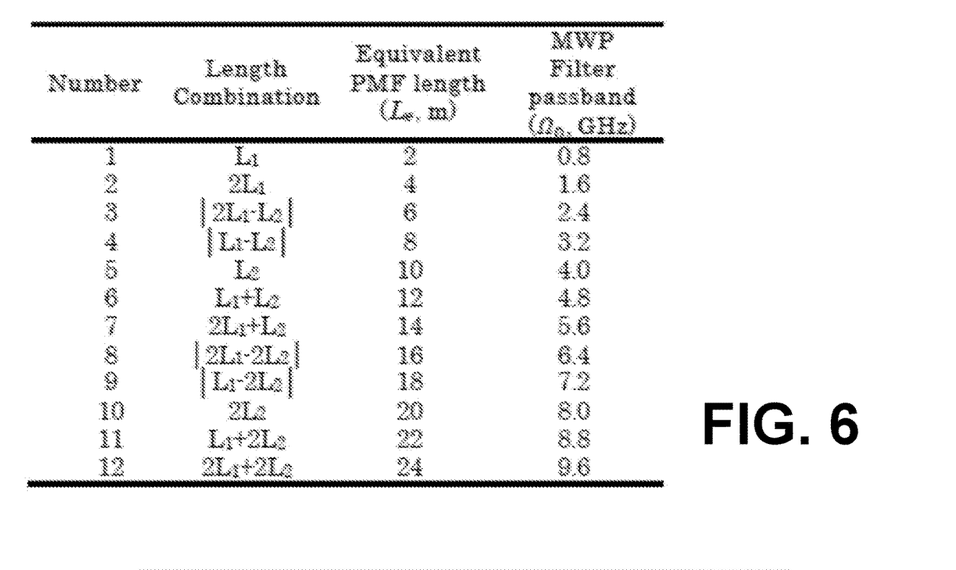
FIG. 6 is a table illustrating an example of the twelve passbands of the MWP multiband filter of FIG. 5 in accordance with various embodiments of the present disclosure.

The two-stage Lyot filter 509 used in the example of FIG. 5 is a modified version of a standard Lyot filter. Each stage includes a piece of polarization maintaining fiber (PMF) 536, polarization controllers (PC) 548 and 551, and two optical circulators 512 and 545. The first stage of the Lyot filter 509 includes a fixed polarization shift (45°) and PC 548*a* as in the one-stage Lyot filter 109 of FIG. 1, while the second stage includes adjustable PC 548*b* and PC 551. With the one-stage Lyot filter 109 of FIG. 1, an optical comb with two selectable spacing was obtained. With a second stage added into the Lyot filter 509, up to 12 selectable spacing can be achieved, corresponding to a MWP multiband filter 500 with 12 different possible passbands. The table of FIG. 6 shows the 12 combinations of the two-stage Lyot filter 500, as well as the calculated relationship between the equivalent length ($L_e$) of the PMF 536 and the passband frequency ($\Omega_0$) of the MWP multiband filter 500. The physical lengths of the PMFs 536*a* and 536*b* in the first and second stages of the Lyot filter 509 are $L_1$=2 m and $L_2$=10 m, respectively. In the experimental tests, both $L_1$ and $L_2$ are set such that all the 12 equivalent lengths ($L_e$) were different and the resultant passbands were evenly distributed within the frequency range of interest.

As discussed with respect to FIGS. 3A-3D and 4A-4D, the performance of the MWP multiband bandpass filter 100 with a one-stage Lyot filter 109 as shown in FIG. 1 was tested. The spectrally sliced Gaussian broadband optical source with different comb spacings is shown in FIGS. 3A-3D, measured by an optical spectrum analyzer with a resolution of 0.8 pm. A piece of 12-m PMF 136 with birefringence of $6.6 \times 10^{-4}$ was used in the one-stage Lyot filter 109. With the proper polarization settings, 30-nm wide Gaussian optical combs with four different comb spacing combinations were observed for 0, 0.66 nm, 0.33 nm and interleaved 0.66 & 0.33 nm, corresponding to a PMF 136 equivalent length ($L_e$) of 0, 12 m, 24 m, and cascaded 12 & 24 m, respectively. The extinction ratios of the comb are over 20 dB for all the combinations. RF spectra of the resultant MWP multiband filter 100 generated from each optical comb are shown in FIGS. 4A-4D, measured by a RF network analyzer 133 with an intermediate frequency bandwidth of 5 kHz. In FIG. 4A, no passband was observed with the filter working in the "all-block" state. While in FIGS. 4B and 4C, the MWP multiband filter 100 was in the "single-passband" state that only included one passband at either 4.8 GHz or 9.6 GHz, respectively. By properly adjusting the PC 148 in the circulator-PC loop to achieve two different comb spacing at the same time, two clean passbands were observed in the RF spectrum with the MWP multiband filter 100 in "multi-passband" state, as shown in FIG. 4D. The four different configurations of the MWP multiband filter 100 are switchable by adjusting the PC 148 to different polarization rotation angles. The 30-nm wide Gaussian profile optical comb can provide enough tap numbers for the MWP multiband filter 100, resulting in better sidelobe suppression and clean filter profile. All the passbands showed consistent performance, with sidelobe suppression of 46 dB and 3-dB bandwidth of 200 MHz.

Figure 7:
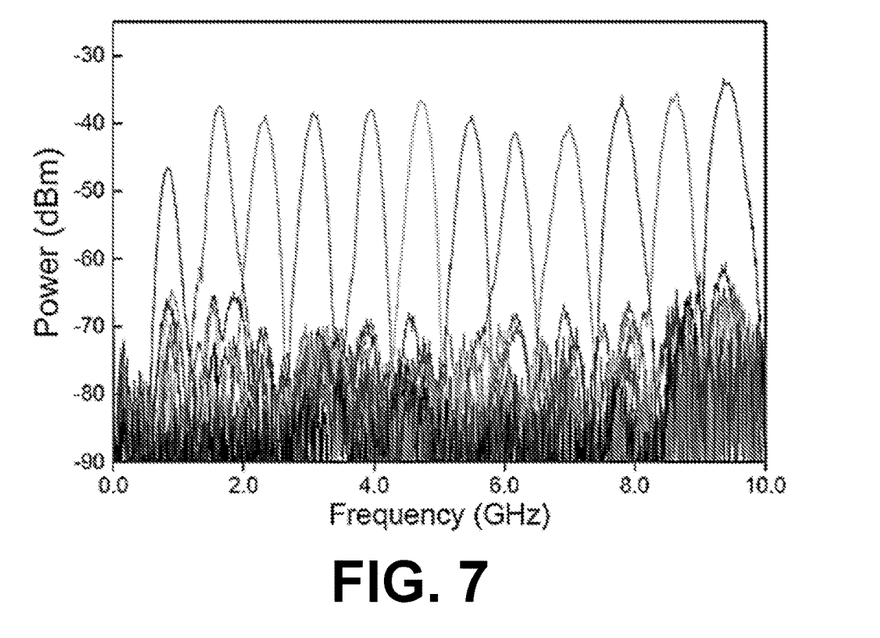
FIG. 7 illustrates frequency spectra of the twelve single passband outputs from the MWP multiband filter of FIG. 5 in accordance with various embodiments of the present disclosure.

With the two-stage Lyot filter 509 of FIG. 5, twelve different bandpass frequencies can be obtained from the MWP multiband bandpass filter 500. Two pieces of PMF 536*a* and 536*b* with lengths of $L_1$=2 m and $L_2$=10 m, respectively, were used. The lengths of the PMFs 536 were chosen to make the equivalent length ($L_e$) to have the same length difference between adjacent combinations, which resulted in an even frequency distribution of all the possible passbands, as shown in table of FIG. 6. First, the MWP multiband filter 500 was set to operate in the single-passband state where only one passband appears at one time. FIG. 7 shows the measured RF frequency spectra of all the 12 different single passband outputs from the MWP multiband filter 500 obtained from 12 different measurements. The single passband of the MWP multiband filter 500 was tuned to 12 different positions through polarization adjustment in the two-stage Lyot filter 509. The 12 passbands were evenly distributed from 0 to 10 GHz with the same frequency spacing of 0.8 GHz, and the experimental results agree well with the calculation values in the table of FIG. 6. The MWP multiband bandpass filter 500 had a 3-dB bandwidth of 200 MHz and sidelobe suppression of up to 40 dB. Note that the sidelobe suppression of the first passband at 0.8 GHz was about 30 dB, which may be attributed to the comb spacing being relatively large in that situation such that there is not enough comb lines (taps) in the MWP multiband filter 500 which results in a lower sidelobe suppression.

Figure 8A:
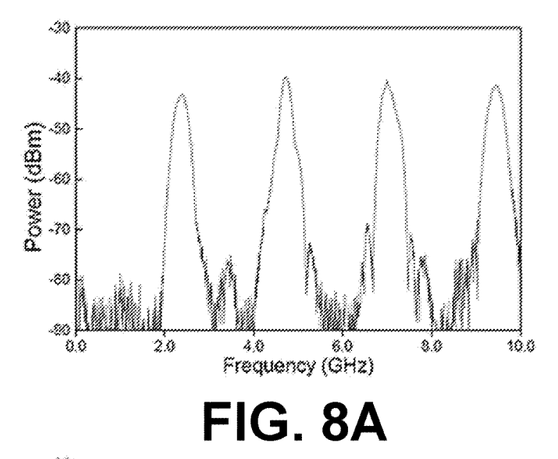
FIGS. 8A-8D illustrate examples of frequency spectra of the MWP multiband filter of FIG. 5 operating in various multi-passband states in accordance with various embodiments of the present disclosure.
Figure 8B:
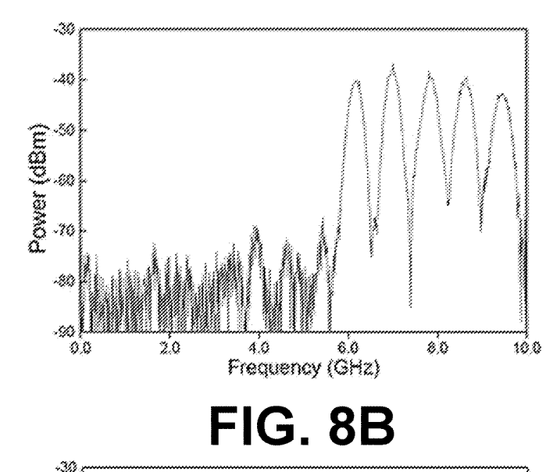
Figure 8C:
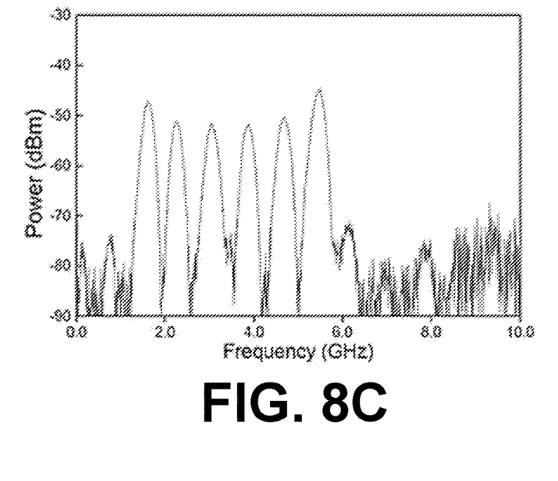
Figure 8D:
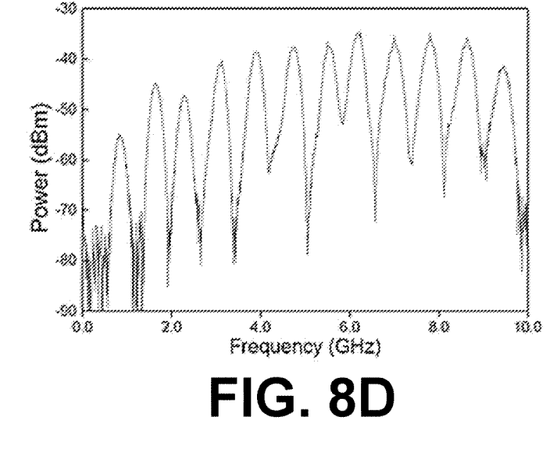

Referring to FIGS. 8A-8D, shown are examples of frequency spectra of the MWP multiband bandpass filter 500 working in the multi-passband state. By setting the two-stage Lyot filter 509 to have different comb spacing combinations, multiband filtering with various combinations of passband frequencies and number of frequency bands can be achieved. In FIG. 8A, four passbands at 2.4 GHz, 4.8 GHz, 7.2 GHz and 9.6 GHz were obtained simultaneously from the MWP multiband filter 500. While in FIGS. 8B and 8C, five and six adjacent passbands from 6.4-9.6 GHz and 1.6-5.6 GHz were obtained, respectively. All the 12 passbands calculated in the table of FIG. 6 were observed at the same time in FIG. 8D, with the same frequency spacing of 0.8 GHz. Sidelobe suppression was over 30 dB for all the passbands except the first passband at 0.8 GHz, as previously discussed. When compared with conventional RF filters, the MWP multiband bandpass filter 500 exhibited uniform passband response, flexible configuration capability and a larger number of passbands.

In summary, embodiments of frequency band selectable MWP multiband bandpass filter have been experimentally demonstrated. Sidelobe suppression of all the passbands can be up to 46 dB with 3-dB bandwidth of 200 MHz in the one-stage Lyot filter configuration. By simply adjusting the polarization stage(s) inside the one-stage Lyot filter 109 or the two-stage Lyot filter 509, the MWP multiband bandpass filter 100 or 500 can work in either all-block, single-passband, or multi-passband states. With the two-stage Lyot filter 509, up to 12 different passbands that evenly distributed from 0 to 10 GHz can be achieved with selectable single-passband or multi-passband combinations. Both the number and position of the passbands are selectable by polarization adjustment in the Lyot filter 509. Sidelobe suppression of all the passbands can be over 30 dB and each passband can have a 3-dB bandwidth of 200 MHz, providing good filter selectivity. The design of the MWP multiband filter 500 significantly increased the number of passbands that can be achieved with a MWP filter as well as providing improved operational flexibility. The MWP multiband bandpass filter 500 can achieve six, ten or more tunable passbands at the same time, which can be extremely useful for multiband signals multiplexing applications.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. All such modifications and variations are intended to be included herein within the scope of this disclosure and protected by the following claims.

It should be noted that ratios, concentrations, amounts, and other numerical data may be expressed herein in a range format. It is to be understood that such a range format is used for convenience and brevity, and thus, should be interpreted in a flexible manner to include not only the numerical values explicitly recited as the limits of the range, but also to include all the individual numerical values or sub-ranges encompassed within that range as if each numerical value and sub-range is explicitly recited. To illustrate, a concentration range of "about 0.1% to about 5%" should be interpreted to include not only the explicitly recited concentration of about 0.1 wt % to about 5 wt %, but also include individual concentrations (e.g., 1%, 2%, 3%, and 4%) and the sub-ranges (e.g., 0.5%, 1.1%, 2.2%, 3.3%, and 4.4%) within the indicated range. The term "about" can include traditional rounding according to significant figures of numerical values. In addition, the phrase "about 'x' to 'y'" includes "about 'x' to about y".

Therefore, at least the following is claimed:

1. A radio frequency (RF) filter, comprising:
a Lyot filter comprising a tunable birefringence loop comprising a length of polarization maintaining fiber (PMF), a circulator and a polarization controller (PC), the PC coupled to a distal end of the PMF through the circulator, where a received optical signal is provided to the PMF through a loop coupling circulator coupled to a proximal end of the PMF, the Lyot filter configured to generate an optical comb based at least in part upon the received optical signal and a polarization rotation angle of the PC; and
a phase modulator (PM) configured to generate a modulated tap signal by modulating the optical comb by a RF input signal.

2. The RF filter of claim 1, wherein the circulator coupled via the PMF is the only circulator coupled to the loop coupling circulator.

3. The RF filter of claim 1, wherein the PC is configured to adjust the polarization rotation angle in a range from 0° to 90°.

4. The RF filter of claim 1, wherein the received optical signal is received by the loop coupling circulator through a first polarizer of the Lyot filter.

5. The RF filter of claim 4, wherein the optical comb is provided to the PM through a second polarizer of the Lyot filter.

6. The RF filter of claim 5, wherein the optical comb provided to the PM is amplified.

7. The RF filter of claim 1, wherein the Lyot filter comprises a second tunable birefringence loop comprising a second circulator and a second PC, the second tunable birefringence loop coupled in series by a second loop coupling circulator.

8. The RF filter of claim 7, wherein each tunable birefringence loop comprises single corresponding loop coupling circulator coupled to a single corresponding circulator via the corresponding PMF.

9. The RF filter of claim 7, wherein the second tunable birefringence loop comprises a second PMF, the second PC coupled to a distal end of the second PMF via the second circulator.

10. The RF filter of claim 9, wherein an output from the tunable birefringence loop is provided to a proximal end of the second PMF via the second loop coupling circulator.

11. The RF filter of claim 10, wherein the output from the tunable birefringence loop is provided to the proximal end of the second PMF via a third PC.

12. The RF filter of claim 7, wherein the received optical signal is received by the loop coupling circulator through a first polarizer of the Lyot filter.

13. The RF filter of claim 12, wherein the optical comb is provided to the PM through a second polarizer after the second loop coupling circulator.

14. The RF filter of claim 7, comprising a photo-detector (PD) configured to generate a RF output signal based upon the modulated tap signal.

15. The RF filter of claim 14, wherein the RF output signal comprises six passbands or more.

16. The RF filter of claim 15, wherein the RF output signal comprises ten passbands or more.

17. The RF filter of claim 14, wherein passbands of the RF output signal comprise an even 3-dB bandwidth of 200 MHz and greater than 30 dB sidelobe suppression.

18. The RF filter of claim 14, comprising a piece of dispersion compensating fiber (DCF) between the PM and the PD to provide a linear delay for wavelengths of the modulated tap signal.

19. The RF filter of claim 1, wherein the received optical signal comprises a broadband optical signal filtered by a Gaussian optical filter.

20. The RF filter of claim 19, wherein the Gaussian optical filter apodizes amplitudes of the modulated tap signal.

* * * * *